United States Patent [19]

Pausch

[11] Patent Number: 4,879,538

[45] Date of Patent: Nov. 7, 1989

[54] MAGNET SYSTEM FOR NUCLEAR MAGNETIC RESONANCE TOMOGRAPHY DEVICES

[75] Inventor: Guenther Pausch, Effeltrich, Fed. Rep. of Germany

[73] Assignee: Siemens Aktiengesellschaft, Berlin and Munich, Fed. Rep. of Germany

[21] Appl. No.: 226,878

[22] Filed: Aug. 1, 1988

[30] Foreign Application Priority Data

Aug. 14, 1987 [DE] Fed. Rep. of Germany ....... 3727234

[51] Int. Cl.$^4$ .............................................. H01F 3/00
[52] U.S. Cl. ...................................... 335/298; 335/301
[58] Field of Search ................ 335/301, 298; 324/318, 324/319, 320, 321

[56] References Cited

U.S. PATENT DOCUMENTS

| 4,698,611 | 10/1987 | Vermilyea | 335/301 X |
| 4,743,853 | 5/1988 | Frese | 335/301 X |

FOREIGN PATENT DOCUMENTS

| 0151036 | 8/1985 | European Pat. Off. . |
| 0167059 | 1/1986 | European Pat. Off. . |
| 0216404 | 4/1987 | European Pat. Off. . |
| 59-60346 | 4/1984 | Japan . |

OTHER PUBLICATIONS

Shimming a Superconducting Nuclear-Magnetic-Resonance Imaging Magnetic With Steel, Hoult et al., Review of Scientific Instruments vol. 56, No. 1, Jan. 1985, pp. 131-135.

Magnetic Field Profiling: Analysis and Correcting Coil Design, Romeo et al., Magnetic Resonance In Medicine vol. 1, No. 1, pp. 44-65 (1984).

*Primary Examiner*—George Harris
*Attorney, Agent, or Firm*—Hill, Van Santen, Steadman & Simpson

[57] ABSTRACT

A magnetic system for nuclear magnetic resonance tomography devices, for generating a homogeneous magnetic field in a volume, has a surface surrounding the volume which is permanently divided into a number of non-overlapping surface elements, each surface element having structure for permitting one or more iron laminae to be attached to the surface element. For any given installation, known calculating methods are used to determine which of the surface elements are to have the laminae attached thereto to produce the desired homogeneous magnetic field.

6 Claims, 2 Drawing Sheets

MAGNET SYSTEM FOR NUCLEAR MAGNETIC RESONANCE TOMOGRAPHY DEVICES

BACKGROUND OF THE INVENTION

1. Field of the Invention

The present invention is directed to a magnet system of the type suitable for use in nuclear magnetic resonance tomography devices, wherein a homogeneous magnetic field is required in the examination volume.

2. Description of the Prior Art

A magnet system of the type used in nuclear magnetic resonance tomography devices is described in European Application No. 0 167 059 wherein, for the purpose of homogenizing the magnetic field produced by the magnet system, the walls of the magnet are provided with pockets for receiving iron laminae can be stacked. Such adjustment of the magnetic field, referred to as shimming, can thus be achieved without the use of current-carrying coils. Pockets for receiving the laminae can also be provided at the exterior of the magnet. When viewed from the end of the magnet system, the pockets have a star shape or configuration. The magnet system also has a plastic-lined opening to which the iron laminae can also be secured. The iron laminae compensates for inhomogeneities produced by magnetic returns within the magnet system. The desired homogenization of the magnetic field is achieved by a suitable selection of the shape, size, arrangement and number of the iron laminae.

The position and respective dimensions of the individual laminae are first calculated to achieve the desired correction on the basis of known, mathematical field calculation methods. The computationally identified position for a particular lamina must then be transferred to the physical structure of the magnet system. To perserve the validity of the mathematical calculations, the actual placement of the laminae within the magnet system must be accomplished with extremely tight tolerances, which requires a relatively complex procedure. Failure to observe such precision will result in a magnetic field having undesired inhomogeneities.

SUMMARY OF THE INVENTION

It is an object of the present invention to provide a magnet system having means for attaching iron laminae thereto which permits transfer of the computationally determined lamina arrangements to the physical magnet system to be accomplished in a simple manner.

The above object is achieved in accordance with the principles of the present invention in a magnet system having a surface which is permanently divided into individual, nonoverlapping surface elements. The surface is continuous, and the division is imaginary, i.e., a structural boundary does not exist for each surface element. Each surface element can be equipped with one or more iron laminae. The precise location for attachment of the iron laminae is thus already defined independently of a specific magnet or specific location of the magnet. As a consequence of the field calculations, only the number and, possibly, the dimensions of the iron laminae to be arranged at the respective surface elements still remain to be determined.

The exact positioning of the laminae can be facilitated in an embodiment wherein each surface element has at least one mount for fastening the iron laminae thereto. The most simple means for attachment can be a threaded bore. The number of laminae required, on the basis of the magnetic field calculation, then need only to be screwed onto the respective surface elements.

A corresponding method for homogenizing a magnetic field in a nuclear magnetic resonance tomography apparatus is disclosed which includes the step of fastening one or more iron laminae to a surface of a magnet system at locations on the surface within a uniform arrangement of fastening points for the laminae.

The magnetic field can thus be homogenized in virtually every magnet system configuration using a supply of iron laminae which is standardized independently of the specific magnet and its location.

DESCRIPTION OF THE PREFERRED EMBODIMENTS

Figure 1:
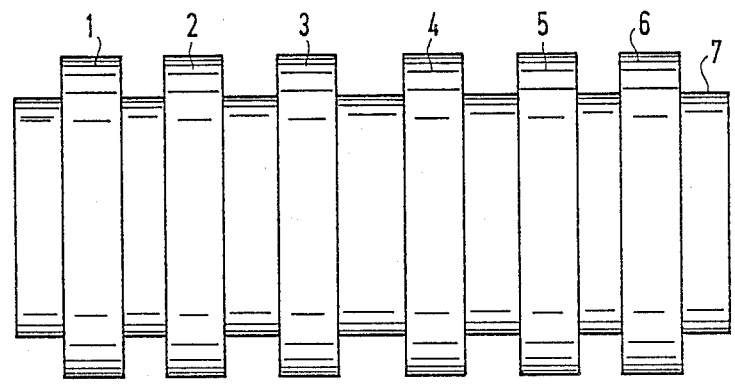
FIG. 1 is a side view of a magnet in a magnet system constructed in accordance with the principles of the present invention.

As shown in FIG. 1, a magnet system for use, for example, in a nuclear magnetic resonance tomography device, may include six coils 1, 2, 3. 4, 5 and 6 in a Helmholtz arrangement. If the coils are superconducting, the coils 1 through 6 will be arranged in a cryostat (not shown) filled with liquid helium. The coils 1 through 6 surround a plastic hollow cylinder 7, the interior of which serves as the examination region.

For examinations using nuclear magnetic resonance tomography, the magnetic field in the examination region must be highly homogeneous.

Figure 2:
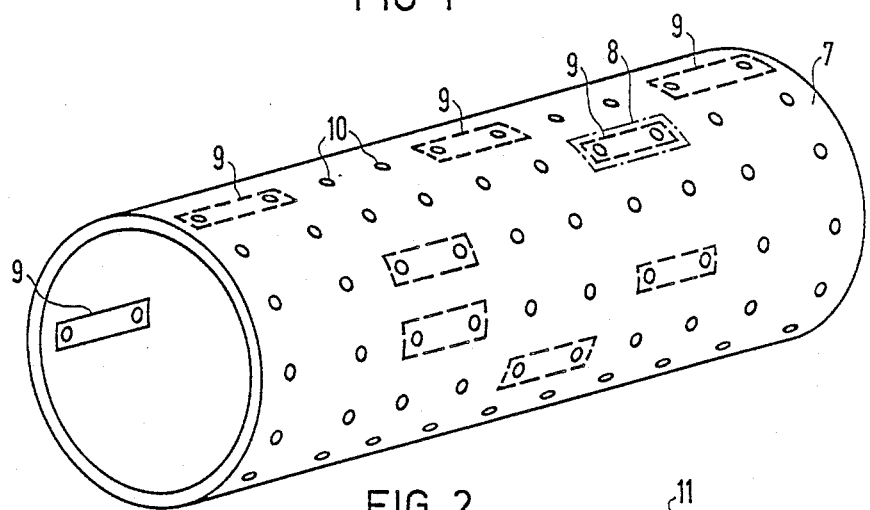
FIG. 2 is a perspective view of a first embodiment of a magnet system constructed in accordance with the principles of the present invention.

To achieve such homogenization, a plurality of iron laminae 9 are applied, in the embodiment of FIG. 2, to the inside of the plastic hollow cylinder 7. For this purpose, the inside surface of the plastic hollow cylinder 7 is divided into a plurality of imaginary non-overlapping surface elements. Such a surface element is symbolically identified as 8 in FIG. 2. The totality of the surface elements 8 need not necessarily completely cover the entire inside surface of the cylinder 7, i.e., gaps may remain between the surface elements 8. The division of the surface of the hollow cylinder 7 into the surface elements 8 is independent of a specific magnet, or a specific location at which the magnet is erected.

In the embodiment of FIG. 2, each surface element 8 has two threaded bores 10 therein which permit a lamina 9 to be attached thereto by screws or bolts.

Figure 4:
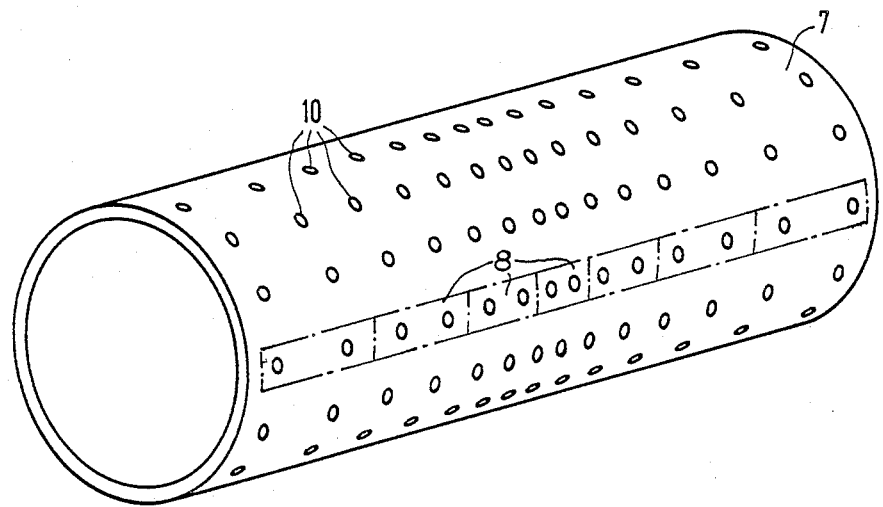
FIG. 4 is a perspective view of a third embodiment of a magnetic system constructed in accordance with the principles of the present invention.

The number of degrees of freedom can be minimized by suitable selection of the surface division, without significantly limiting the possibilities for field correction. The expanse or length of the surface elements 8 may increase in the longitudinal direction from the inside toward the outside, with the successive surface elements 8 touching each other, as shown in FIG. 4 for an exemplary row (recognizing that all elements 8 need not necessarily be occupied by laminae).

Around the circumference of the cylinder 7, the surface elements 8 need not be continuous, i.e., azimuthal gaps can be present, the size and arrangement of the azimuthal gaps being essentially dependent on the radius relationshio of the homogeneity volume to the surface elements 8, and on the width of the surface elements 8. In the exemplary embodiment shown in FIG. 2, sixteen equidisantly disposed angular positions are distributed around the circumference of the cylinder 7.

The possible positions for the iron laminae 9 are prescribed by the surface elements 8. A suitable occupation of the predetermined positions defined by the surface elements 8 with iron laminae 9 need simply be calculated on the basis of known mathematical procedures. A standardized set of iron laminae 9 having a uniform arrangement of bores corresponding to the threaded bores 10 of the surface elements 8 can be orovided with each system. The iron laminae 9 can vary in length, width and/or thickness in selected gradations.

The effect of a ferromagnetic material having a given magnetization and a given thickness, which covers one of the surface elements 8, can be calculated in a defined grid. Such a calculating method is described, for example, in the article "Magnetic Field Profiling, Analysis and Correcting Coil Design," Romeo et al, Magnetic Resonance in Medicine 1, (1984), pages 44–65. A number of suitable optimization methods are also known, for example, those described in "Numerical Optimization Techniques for Engineering Desing," Vanderplaats, 1984, pages 140–147, by means of which the occupation of the surface elements 8 for a given distribution of field deviations $\Delta B$ can be determined, such that the homogeneity is optimum in the sense of the particular algorithm which is employed.

The surface elements 8 are then occupied with one or more laminae 9 from the set of standardized laminae which are available, on the basis of these calculating methods. As a consequence of the prescribed positioning, there are no problems in the transfer of the computational results to the existing physical geometry of the magnetic system.

After all of the designated surface elements 8 have been occupied with appropriate iron laminae 9, the field inhomogeneities in the examination region are minimized.

High-homogeneity fundamental fields can be generated exclusively using passive measures, i.e., without shim coils, with the method described herein. The laminae 9 do not have to be individually tailored nor do individual fastening points have to be created, so that the method can be simply and quickly employed.

Figure 3:
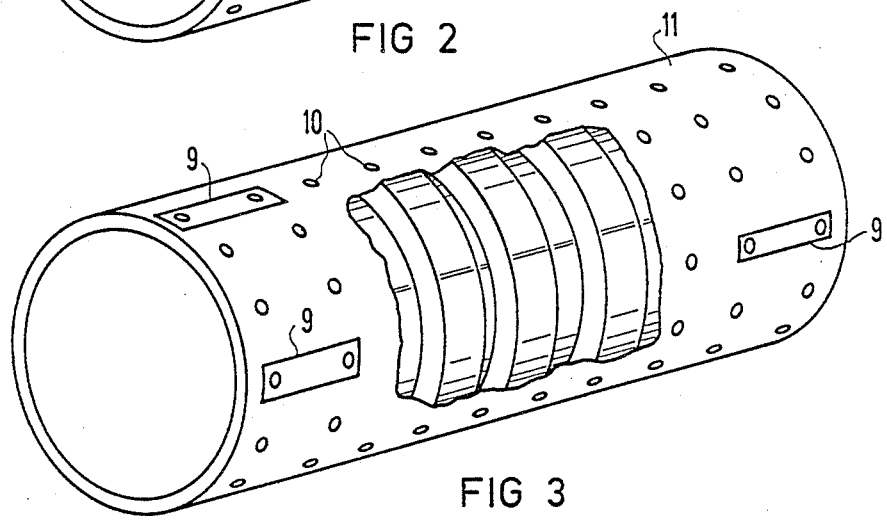
FIG. 3 is a perspective view of a second embodiment of a magnet system constructed in accordance with the principles of the present invention.

As shown in FIG. 3, the same structure and method can be used at prescribed positions on the outer surface 11 of the magnet system. Although the influence of the iron laminae 9 on the magnetic field at this location is less than in the embodiment of FIG. 2 wherein the laminae are disposed on the inner surface, the accessibility to the laminae 9, given an assembled nuclear magnetic resonance tomography device, is greater in the embodiment of FIG. 3.

Although modifications and changes may be suggested by those skilled in the art it is the intention of the inventor to embody within the patent warranted hereon all changes and modifications as reasonably and properly come within the scope of his contribution to the art.

I claim as my invention:

1. A magnet system for generating a homogeneous magnetic field in an examination volume of a nuclear magnetic resonance tomography apparatus, said magnet system comprising:

magnetic means for generating a magnetic field in said examination volume;

a surface surrounding said examination volume, said surface being permanently divided into a plurality of non-overlapping surface elements, each of said surface elements having an expanse increasing in a longitudinal direction of said surface from inside to outside, with successive ones of said surface elements disposed in contact with each other; and a plurality of iron laminaee attached and matched in size to selected ones of said surface elements to homogenize said magnetic field.

2. A magnet system as claimed in claim 1, wherein each surface element has means for fastening at least one of said iron laminae thereto.

3. A magnet system as claimed in claim 1, wherein said surface is an inner surface of said magnet means.

4. A magnet system as claimed in claim 1, wherein said surface is an outer surface of said magnet means.

5. A magnet system as claimed in claim 1, wherein said surface has a circumference, and wherein said surface elements are equidistantly arranged around said circumference with gaps between successive surface elements.

6. A method for homogenizing a magnetic field of an examination volume in a nuclear magnetic resonance tomography apparatus, said method comprising the steps of:

surrounding said examination volume with a surface;

permanently dividing said surfaoe into a plurality of non-overlapping surface elements;

providing a standardized set of iron laminae adapted for individual attachment to respective ones of said surface elements;

mathematically determining which of said surface elements are to be occupied with one of said iron laminae based on standard electromagnetic field calculations; and selectively fastening iron laminae to said respective ones of said surface elements determined by said calculations.

* * * * *